United States Patent
Irwin et al.

(10) Patent No.: US 10,050,773 B1
(45) Date of Patent: Aug. 14, 2018

(54) BOOTSTRAPPED AUTONEGOTIATION CLOCK FROM A REFERENCELESS CLOCK CHIP

(71) Applicant: MoSys, Inc., Santa Clara, CA (US)

(72) Inventors: Scott A Irwin, Ames, IA (US); Charles W Boecker, Ames, IA (US)

(73) Assignee: MoSys, Inc., San Jose, CA (US)

( * ) Notice: Subject to any disclaimer, the term of this patent is extended or adjusted under 35 U.S.C. 154(b) by 0 days.

(21) Appl. No.: 15/199,979

(22) Filed: Jun. 30, 2016

Related U.S. Application Data

(60) Provisional application No. 62/187,237, filed on Jun. 30, 2015.

(51) Int. Cl.
| | |
|---|---|
| *H04L 7/00* | (2006.01) |
| *H04L 7/033* | (2006.01) |
| *H04L 7/027* | (2006.01) |
| *H03L 7/08* | (2006.01) |

(52) U.S. Cl.
CPC .......... *H04L 7/0331* (2013.01); *H03L 7/0807* (2013.01); *H04L 7/027* (2013.01)

(58) Field of Classification Search
CPC ...... H04L 7/0331; H04L 7/027; H03L 7/0807
See application file for complete search history.

(56) References Cited

U.S. PATENT DOCUMENTS

| | | | |
|---|---|---|---|
| 6,343,364 B1* | 1/2002 | Leydier | G06F 1/04 713/500 |
| 2009/0077298 A1* | 3/2009 | Whitby-Strevens | G06F 13/4027 710/315 |
| 2011/0138096 A1* | 6/2011 | Radulescu | G06F 13/385 710/305 |
| 2015/0372803 A1* | 12/2015 | Jiang | H04L 7/0062 375/355 |
| 2016/0204950 A1* | 7/2016 | Edwards | H04L 41/083 307/1 |
| 2016/0359754 A1* | 12/2016 | Gravel | H04L 47/25 |

* cited by examiner

Primary Examiner — Freshteh N Aghdam

(57) ABSTRACT

A method, system and apparatus, for bootstrapping an autonegotiation signal in an intermediate device. The intermediate device initializes using a referenceless clock circuit. The intermediate device then recovers a more accurate clock sourced from a second device via a clock data recovery circuit in the intermediate device. The second device has a physical medium attachment interface within the intermediate device that does not require autonegotiation. The autonegotiation signal is communicated to a first device having a physical medium dependent interface to the intermediate device, thus requiring autonegotiation.

20 Claims, 3 Drawing Sheets

BOOTSTRAPPED AUTONEGOTIATION CLOCK FROM A REFERENCELESS CLOCK CHIP

PRIORITY CLAIM

This application claims priority to provisional application(s): Ser. No. 62187237 filed Jun. 30, 2015; entitled "BOOTSTRAPPED AUTONEGOTIATION CLOCK FROM A REFERENCELESS CLOCK CHIP," which application(s) are also incorporated by reference herein in their entirety. Furthermore, where a definition or use of a term in a reference, which is incorporated by reference herein, is inconsistent or contrary to the definition of that term provided herein, the definition of that term provided herein applies and the definition of that term in the reference does not apply.

FIELD OF TECHNOLOGY

This disclosure relates generally to the technical fields of clocking integrated circuits and in one example embodiment, this disclosure relates to a method, apparatus and system of generating an autonegotiation signal using a referenceless clock.

BACKGROUND

Referenceless clock chips are able to generate a clock without the benefit of a direct external reference clock input, e.g., without a crystal oscillator source. Thus, the chip does not require routing for a reference clock input and does not consume pins on the chip for the reference clock. However, the referenceless clock is not tightly controlled, having a frequency variation up to thirty percent or more from chip to chip. This variation arises from process, voltage, and temperature (PVT) differences in manufacturing processes and in operating conditions, both from die to die and from wafer to wafer. Resultantly, while the free running oscillator of a referenceless clock can have a target frequency, e.g., 120 MHz, the actual operating frequency of a given die can vary +/−50% from the target frequency, e.g., 60 MHz to 180 MHz. This variation is amenable to a chip design without critical timing functions, e.g., setup and hold times, etc. For example, simple devices such as a flip-flop or a state machine can usually withstand the wide frequency ranges of a referenceless clock, assuming the timing requirements of the circuit are suitable for the noted frequency range. Another drawback to a referenceless clock chip is that overall time to startup time can change, e.g., being fast for a chip having a high frequency referenceless clock and being slow for a chip with a low frequency referenceless clock.

In a network setting, IEEE standards dictate different protocols for chip initialization and bring up, e.g., depending on whether they are long reach ("LR") or short reach ("SR"). There are two categories for bringing up devices. The first category is a physical medium attachment ("PMA") interface, typically for short-reach (SR) devices, which simply starts communicating without any negotiating. These devices communicate over lower loss medium, with typical losses of less than 15 dB at Nyquist. The PMA interface also performs functions such as clock recovery, data recovery, and clock generation. The second category is a physical medium dependent ("PMD") interface, typically for long-reach (LR) devices that communicates with a backplane. These devices communicate over higher loss medium, with typical losses of greater than 25 dB at Nyquist. Example specifications included IEEE 802.3bj 100GBASE-CR4, 100GBASE-KR, etc. For PMD interfaces, executing an autonegotiation ("AN") protocol is required to establish an agreed operating frequency and lane use between the two devices, e.g., between a host network processor and the optical module, before the devices can start transmitting (mission mode) data between them. Autonegotiation requires a pulse width of 3.2 ns+/−100 parts per million ("ppm"). This stringent clock spec cannot be satisfied solely with a referenceless clock. Thus, a typical device with PMD connectivity uses a direct input from a reference clock in order to perform the autonegotiation with a device on the backplane.

SUMMARY

A method, system and apparatus, is disclosed for bootstrapping an autonegotiation signal using a referenceless clock circuit on an intermediate IC, and then recovering a more accurate clock sourced from an external chip using a clock data recovery circuit on the intermediate IC. This solution has the benefit of saving a pins on the device and area/power on the PC board for a reference clock, while retaining the ability to satisfy the stringent autonegotiate protocol. The autonegotiation protocol allows two coupled devices to choose common transmission parameters, such as speed and number of lanes used to make a link. One benefit of autonegotiation is the ability to operate devices in a mixed network environment which can contain multiple isochronous and/or non-isochronous LAN protocols such as Isochronous-Ethernet, Ethernet, isochronous-token ring, token ring, other isochronous-LAN or other LAN Systems One embodiment is an intermediate integrated circuit (IC) including a receiver, a transmitter, a referenceless clock circuit coupled to the receiver, and training logic coupled to the transmitter. The referenceless cock circuit generates a first clock signal, which is a referenceless clock signal, which is used for control plane functions, startup and shut down of the intermediate circuit. The referenceless clock signal is also initially used to bring up, and periodically adjust the frequency of a clock data recovery (CDR) circuit in the intermediate IC. The CDR is used, in turn, to recover a second clock signal. The second clock signal is recovered from a data signal received from a second device. The intermediate IC uses this recovered clock signal as an internal clock signal of the intermediate IC itself. The second device has a PMA interface to the intermediate IC, which does not require an autonegotiation protocol to communicate, and thus, its data signal is available immediately for recovering a more accurate clock in the intermediate device. The CDR itself further comprises a phase lock loop (PLL) for aligning the internal clock signal recovered by the CDR to a desired phase, and a clock scaler coupled to the PLL for scaling the internal clock signal, e.g., dividing or multiplying it to a desired frequency. The training signal is an autonegotiation data signal specified by an autonegotiation protocol.

The internal clock signal of the intermediate IC is used to i) generate a training sequence to be transmitted from the intermediate IC to a first device such that the first device can communicate with the intermediate IC; and ii) after the communication is established between the intermediate IC and the first device, to operate a device A to device B ("A2B") interface in the intermediate IC to communicate data from the second device to the first device. The first device has a physical medium device ("PMD") interface to the intermediate device, which requires the autonegotiate protocol in order to establish communication with another device, e.g., the intermediate IC and the first device. To accommodate this need, the training logic of the intermediate device is configured to generate a training signal to be transmitted to the first device, even though the intermediate device originally had no external reference clock signal. However, the internal clock signal, rather than the referenceless clock signal, is used to generate the training signal to be sent to the first device, because the referenceless clock signal is not sufficiently accurate.

The intermediate device also includes an additional receiver, an additional transmitter, and an additional CDR circuit for recovering an additional internal clock signal. The additional internal clock signal, which is the third clock signal for the intermediate IC, is recovered from a data signal received from a first device, with the PMD interface. This clock is recovered after the autonegotiation process completes on the PMDs and they transition to mission mode, transmitting desired traffic. The PMD on the intermediate device uses the data to recover this third clock. The additional internal clock signal is used to operate a device B to device A ("B2A") interface in the intermediate IC to communicate data from the first device to the second device. Thus, a complete full duplex communication link is established between a second device with a PMA interface, an intermediate device with a referenceless clock, and a first device with a PMD interface. The intermediate device used three separate and increasingly accurate clock signals. The second internal clock signal, recovered from the second device and the third internal clock signal, recovered from the first device, were both more accurate in phase and frequency than the first internal clock signal of the intermediate circuit, the referenceless clock signal.

The network system comprises all three devices, namely, the first device with the PMA interface, the intermediate IC, the second device with a PMD interface, and the physical medium coupling them.

Means for generating the internal clock signal from an external data signal that is not a clock signal include any sampling method and apparatus that is able to extract the clock signal embedded in its transitions of the external data signal, including i) a phase locked loop architecture solution; ii) a synchronous oscillator which is much less common, but which may have some advantages over PLL in certain cases, and iii) a gated oscillator, which resembles the synchronous oscillator, and which is useful for very fast acquisition and which has other performances tradeoffs. Additionally, means for generating the training signal based on the internal clock signal include any type of driver and any type of logic to generate and transmit one or more specified pulse widths with specified time intervals, per the autonegotiation protocol. And means for sequentially generating a plurality of increasingly accurate, in frequency and phase, and separate clock signals includes any implementation to generate a first clock as a referenceless clock on the intermediate IC, which typically has wide frequency variation, and any type of CDR apparatus for recovering a more accurate clock from a received data signal, which itself is accurately controlled to a specification including a frequency tolerance of 0 to 100 parts per million ("PPM").

The methods, operations, processes, systems, and apparatuses disclosed herein may be implemented in any means for achieving various aspects, and may be executed in a form of a machine-readable medium, and/or a machine accessible medium, embodying a set of instructions that, when executed by a machine or a data processing system (e.g., a computer system), in one or more different sequences, cause the machine to perform any of the operations disclosed herein. Other features will be apparent from the accompanying drawings and from the detailed description that follows. Accordingly, the specification and drawings are to be regarded in an illustrative rather than a restrictive sense.

BRIEF DESCRIPTION OF THE VIEW OF DRAWINGS

Example embodiments are illustrated by way of example and not limitation in the figures of the accompanying drawings, in which like references indicate similar elements and in which.

Figure 1:
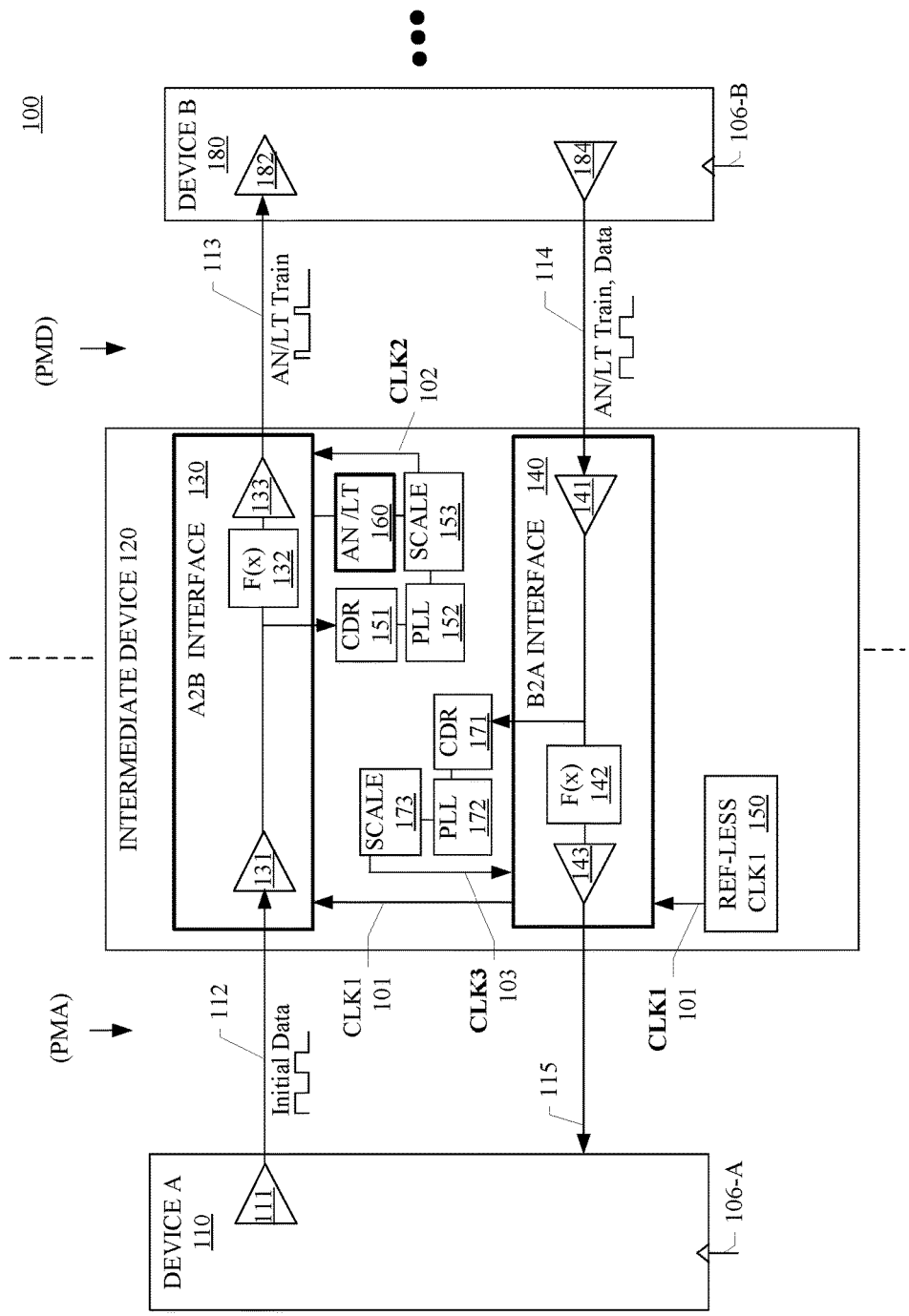
FIG. 1 is a block diagram of a network system having a second device having a PMA interface, an intermediate IC with bootstrapped autonegotiation capability, and a first device having a PMD interface, according to one or more embodiments.

The drawings referred to in this description should be understood as not being drawn to scale, except if specifically noted, in order to show more clearly the details of the present disclosure. Same reference numbers in the drawings indicate like elements throughout the several views. Other features and advantages of the present disclosure will be apparent by reference to the detailed description when considered in conjunction with the figures.

DETAILED DESCRIPTION

A method, apparatus and system for bootstrapping an autonegotiation clock is disclosed. In the following description, for the purposes of explanation, numerous specific details are set forth in order to provide a thorough understanding of the various embodiments. It will be evident, however to one skilled in the art that various embodiments may be practiced without these specific details.
System Block Diagram Referring now to FIG. 1, a block diagram of a network system 100 is shown that includes a second device 110 having a PMA interface, an intermediate IC 120 with bootstrapped autonegotiation capability, and a first device 180 having a PMD interface, according to one or more embodiments.

Device A 110, also referred to as second device, has a reference clock input 106-A that enables it to accurately communicates data to intermediate device 120, also referred to as intermediate integrated circuit ("IC") via link 112. This data has the benefit of a high-speed and reference-based clock that is highly accurate.

Intermediate device 120 is a referenceless clock chip with no reference clock input, i.e., there is no specific dedicated pin for a direct reference clock signal to be input to intermediate chip 120. Initially, on-chip referenceless clock circuit 150 generates a referenceless on-chip clock signal 101 (CLK1) (without a reference clock input to the chip). The on-chip referenceless clock circuit 150 is sufficiently accurate to operate the control plane; state machines such as those used for bring up and power down of the intermediate IC; operation settings of the intermediate IC such as the equalization coefficient setting; and other devices that do not have critical timing requirements. However, the referenceless on-chip clock signal 101 is not accurate enough to operate mission mode high-speed data paths, such as Ethernet, because the referenceless clock circuit 150 varies too much from chip to chip in production and in operation, due to PVT variations. The referenceless clock circuit 150 is coupled to B2A interface 140 and A2B interface 130 to communicate CLK1 signal 101 to various control plane devices, to B2A interface 140, and to A2B interface 130 for use therein, e.g., for bring up of the CDRs 151 and 171, etc.

Device B 180 has a Physical Medium Dependent ("PMD") interface to intermediate device 120. A PMD interface requires an accurate training signal for autonegotiation and link training prior to communicating. However, because intermediate device only starts with a referenceless clock signal CLK1 on line 101, it is not initially capable of communicating with first device 180. Instead, intermediate device 120 must first locate and capture a more accurate internal clock, from which it will then be able to train with first device 180 for establishing a high-speed communication link.

Second device 110 has a Physical Medium Attachment ("PMA") interface to the intermediate device 120. Because a PMA interface does not require protocol training, it can transmit data immediately, which enables the intermediate IC 120 to recover an internal clock from the data signal transmitted from second device 110 via line 112 to receiver 131 in A2B interface 130. The clock recovery proceeds as follows. A clock data recovery ("CDR") block 151 in intermediate device 120 receives the data signal from second device 110 and initiates the clock recovery. An initial recovered clock signal is communicated to the phase lock loop ("PLL") 152, to which it is coupled, for adjustment of the phase, is communicated to the scale block 153, to which it is in turn coupled, for multiplying or dividing to the desired frequency, and finally is communicated to the A2B interface as CLK2 102, via a clock distribution tree. While many of the components of intermediate device 120 are initially brought up by the referenceless clock CLK1 101, they quickly transition to a more accurate clock, such as CLK2 102, which ultimately is responsible for clocking all devices in the datapath from second device 110 to first device 180.

Once intermediate device 120 recovers a sufficiently accurate internal clock, it can begin training with first device 180 in order to complete the bidirectional communication loop from second device 110 to first device 180 and from first device 180 back to second device 110. The training proceeds as follows. Intermediate device 120 includes a training logic 160, which can be configured to perform a wide variety of training protocols such as autonegotiation ("AN"), link training ("LT"), etc., per a given industry standard such as IEEE 802.3, or a proprietary methodology. Once an accurate clock is available, i.e. CLK2 102, a training signal, e.g., an AN or a LT signal, can be generated by training block 160 and transmitted to the A2B interface 130 to which it is coupled. As mentioned, the referenceless clock signal CLK1 101 is not sufficiently accurate to generate or transmit the training signal. The A2B interface 130 in turn transmits the training signal via transmitter 133 on line 113 to receiver 182 of first device 180. The first device 180 processes the training signal per the industry protocol, and then transmits a corresponding training signal back out via transmitter 184 on line 114 to receiver 141 of B2A interface 140. Autonegotiation completes once the devices agree upon the rate and number of lanes that they will use for communication. Once AN completes and the PMDs train the Link, the PMD interfaces transition to mission mode and sending mission mode data. Similar to A2B interface 130, the present B2A interface also initially is brought up by the referenceless clock signal CLK1 on line 101. Next, with access to an accurate data signal from first device 180, CDR block 171, PLL 172, and scale block 173 are able to recover another accurate internal clock, referred to as CLK3 on line 103. CLK3 is fed back to B2A interface 140 for clocking devices in the datapath for data communicated from first device 180 to second device 110 via transmitter 143 on line 115.

Now that sufficiently accurate internal clocks are available, i.e., CLK2 on line 102 and CLK3 on line 103, and are used to clock devices in the datapath for the A2B interface 130 and the B2A interface 140, respectively, full duplex communication is established, despite intermediate device 120 having only a referenceless clock at initialization, and no reference clock input signal. The A2B interface also includes functional logic 132 that can perform a desired function on the data per a wide variety of applications such as retiming, reshaping, muxing, reading, parsing, modifying, etc. Similar to A2B interface 130, the B2A interface 140 also has a functional block 142 with similar capabilities for processing data communicated between first device 180 and second device 110.

Figure 2:
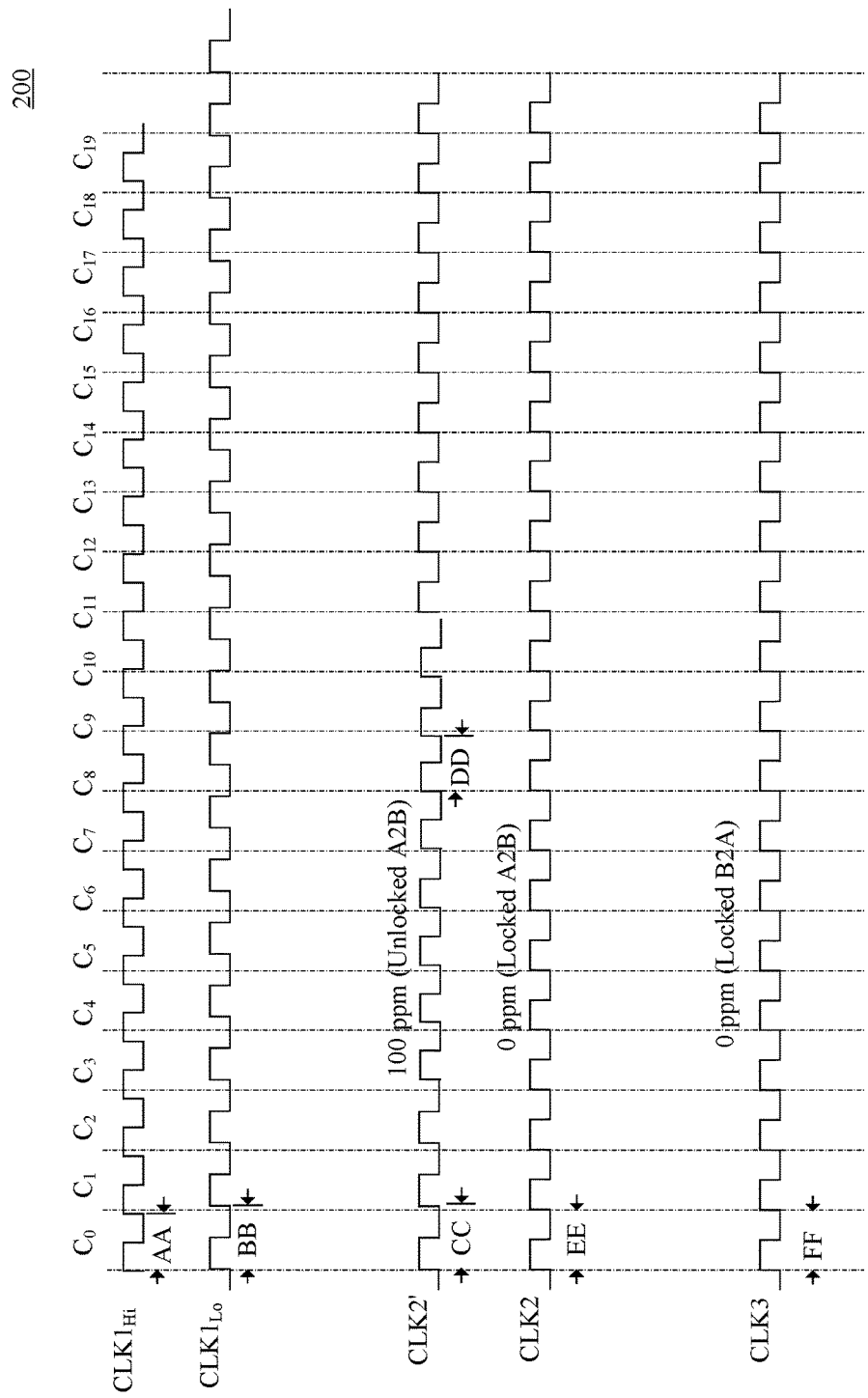
FIG. 2 is a timing diagram of three internal clock signals of the intermediate IC, used to communicate with the first device and the second device, according to one or more embodiments.

Referring now to FIG. 2, a timing diagram 200 is shown of three internal clock signals of the intermediate IC, used to communicate with the first device and the second device, according to one or more embodiments.

$CLK1_{Hi}$ represents a referenceless clock that has a higher (Hi) than nominal frequency due to PVT factors that contributes to it. As shown, period AA is less than the nominal period, shown by the clock markers, and thus the frequency is higher than nominal. In contrast, $CLK1_{Lo}$ represents a referenceless clock that has a lower (Lo) than nominal frequency due to PVT factors that contributes to it. As shown, period BB is greater than the nominal period, shown by the clock markers, and thus the frequency is lower than nominal. Regardless of this frequency variation by the referenceless clock, CLK1, the present circuit of FIG. 1, and procedure of FIG. 3, enables the intermediate device 120 to establish communication to a device with a PMD interface.

The next clock signal is CLK2', which is the recovered clock signal with an unlocked A2B interface. This means that CDR 151 in FIG. 2 has not yet locked onto the data signal received from the PMA interface of the second device 110. Thus, it has periodic variations of CC that is greater than nominal, and DD, which is less than nominal, as it hunts for a lock on the recovered clock of the incoming data. After sufficient tracking and adjustment, an accurate CLK2 is locked on the incoming data the second device, with nominal period EE, and 0 PPM variation, for communicating said incoming data on the A2B interface. A third internal clock signal, CLK3 to is able to lock, with 0 PPM, once incoming data is present at the PMD interface that is connected to the first device, and thus provide accurate high-speed communication from the first device to the second device via the B2A interface. Thus, FIG. 2 shows the a progression of a plurality of increasingly accurate and separate clock signals generated and recovered by the intermediate device to enable communication between PMA and PMD interfaces.

Figure 3:
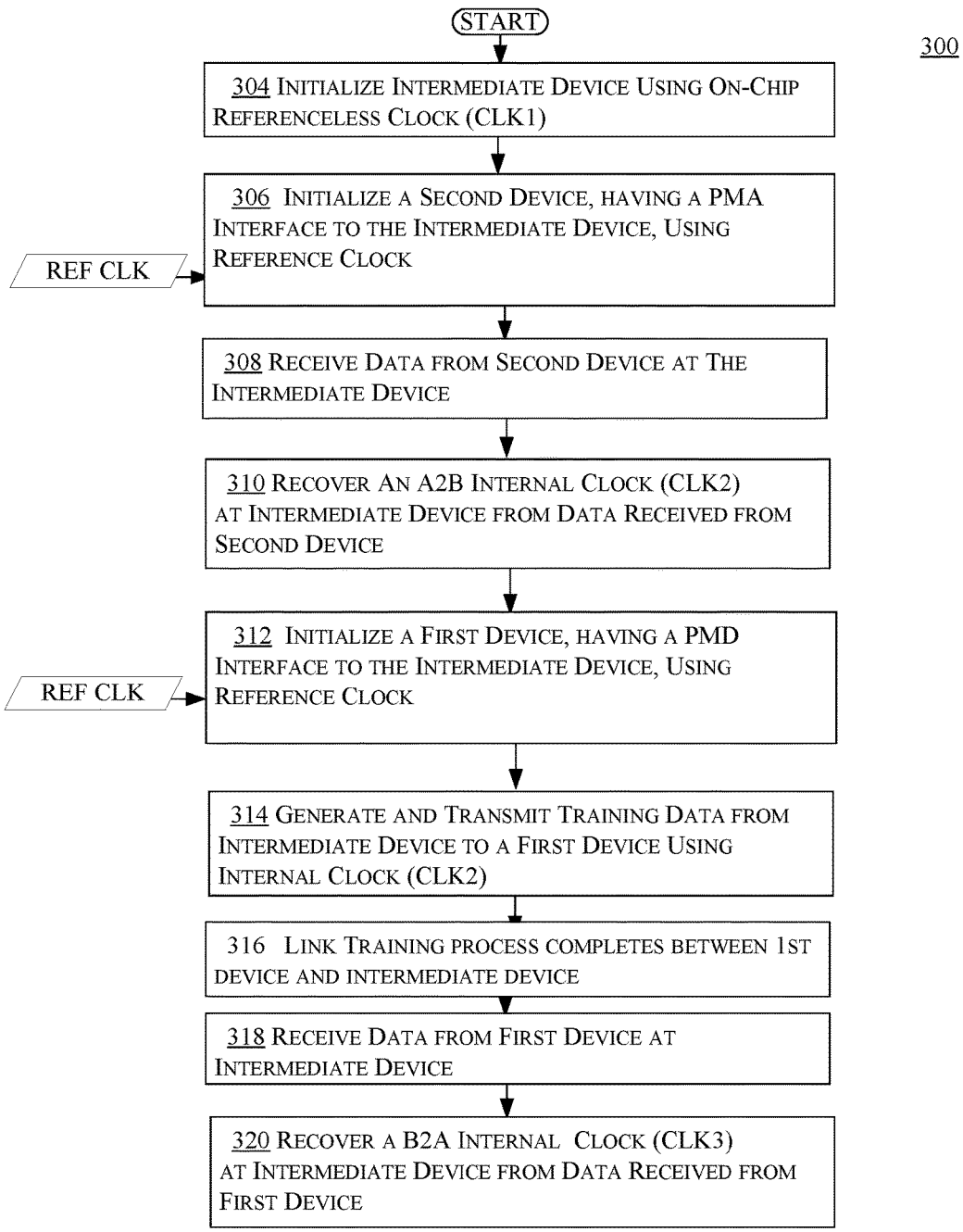
FIG. 3 is a flowchart of a method to bootstrap an autonegotiation data sequence from a referenceless clock intermediate device, according to one or more embodiments.

Referring now to FIG. 3, a flowchart 300 is shown of a method to bootstrap an autonegotiation data sequence from a referenceless clock intermediate device, according to one or more embodiments.

In operation 304, the intermediate device 120 is initialized using an on-chip referenceless clock circuit 150, to generate a first internal clock signal CLK1 on line 101, as shown in FIG. 1.

In operation 306, a second device 110, having a PMA interface to the intermediate device 120, is initialized using a reference clock, i.e., 106-A. While the reference clock input is shown, an alternative embodiment can use a CDR in second device 110 (not shown) to recover a clock from an upstream device coupled thereto. In this manner, the data stream transmitted from second device 110 to intermediate device 120 would still have a locked clock with 0 PPM, per the Ethernet protocol. Consequently, downstream devices with a PMA interface, such as the intermediate device 120, would still have the ability to recover a clock therein.

In operation 308, data is received from second device at the intermediate device. This allows subsequent operation 310 to recover an A2B internal clock (CLK2) at the intermediate device 120 from the data received from the second device, as described in FIG. 1 herein.

Next, in operation 312 the first device 180, having a PMD interface to the intermediate device, is initialized using a reference clock, i.e., 106-B of FIG. 1. This operation is similar to operation 306.

In operation 314 training data, such as AN and LT, is generated and transmitted from the intermediate device 120 to the first device 180. This will allow communication to be established between the intermediate device 120 and the first device 180 by establishing transmission parameters, such as speed and number of lanes used as the Link.

In operation 316 the autonegotiate and link training processes between the first device and the intermediate device finishes. At this point the B2A interface 140 switches over to mission mode and the transmission of actual payload data.

In operation 318, data is received from the first device 180 at the intermediate device 120, at which point operation 320 will recover a B2A internal clock, CLK3 on line 103 at intermediate device 120.

As a result of the aforementioned apparatus, system, and method, the present disclosure provides a more robust intermediate device, such as a repeater, retimer, mux, gearbox, etc., that does not require the use of a reference clock, thereby reducing pin count, system power, and system area, while still retaining the ability to autonegotiate with a device having a PMD interface. The current solution reduces cost and complexity of the intermediate device and the system it is used in.

Alternatives:

References to methods, operations, processes, systems, and apparatuses disclosed herein that are implementable in any means for achieving various aspects, and may be executed in a form of a machine-readable medium, e.g., computer readable medium, embodying a set of instructions that, when executed by a machine such as a processor in a computer, network system, integrated circuit, server, etc. cause the machine to perform any of the operations or functions disclosed herein. Functions or operations may include clocking, transmitting, receiving, timing, initializing, muxing, demuxing, and the like.

The present disclosure is applicable to any type of network including the Internet, an intranet, and other networks such as local are network (LAN); home area network (HAN), virtual private network (VPN), campus area network (CAN), metropolitan area network (MAN), wide area network (WAN), backbone network (BN), global area network (GAN), or an interplanetary Internet. The present disclosure is applicable to any type of medium in a network including copper, fiber, etc.

Methods and operations described herein can be in different sequences than the exemplary ones described herein, e.g., in a different order. Thus, one or more additional new operations may be inserted within the existing operations or one or more operations may be abbreviated or eliminated, according to a given application, so long as substantially the same function, way and result is obtained.

Although the present embodiments have been described with reference to specific example embodiments, it will be evident that various modifications and changes may be made to these embodiments without departing from the broader spirit and scope of the various embodiments.

For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine-readable medium). Similarly, the modules disclosed herein may be enabled using software programming techniques. For example, the various electrical structure and methods may be embodied using transistors, logic gates, and electrical circuits (e.g., application specific integrated ASIC circuitry and/or in Digital Signal; Processor DSP circuitry). Other features of the present embodiments will be apparent from the accompanying drawings and from the detailed description. In addition, it will be appreciated that the various operations, processes, and methods disclosed herein may be carried out, at least in part, by processors and electrical user interface controls under the control of computer readable and computer executable instructions stored on a computer-usable storage medium. The computer readable and computer executable instructions reside, for example, in data storage features such as computer usable volatile and non-volatile memory and are non-transitory. However, the non-transitory computer readable and computer executable instructions may reside in any type of computer-usable storage medium.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to in that context.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph six, interpretation for that unit/circuit/component.

Unless specifically stated otherwise as apparent from the foregoing discussions, it is appreciated that throughout the present description of embodiments, discussions utilizing terms such as "generating," "transmitting", "operating," "receiving," "aligning,", "scaling," "communicating," "executing," "replacing," or the like, refer to the actions and processes of an integrated circuit, an ASIC, a memory device, a computer system, or similar electronic computing device. The memory device or similar electronic computing device manipulates and transforms data represented as physical (electronic) quantities within the devices' registers and memories into other data similarly represented as physical quantities within the devices' memories or registers or other such information storage, transmission, or display devices.

The foregoing descriptions of specific embodiments of the present disclosure have been presented for purposes of illustration and description. They are not intended to be exhaustive or to limit the invention to the precise forms disclosed. Many modifications and variations are possible in light of the above teaching without departing from the broader spirit and scope of the various embodiments. The embodiments were chosen and described to explain the principles of the invention best and its practical application, and thereby enable others skilled in the art to best utilize the invention and various embodiments with various modifications as are suited to the particular use contemplated. It is intended that the scope of the invention be defined by the Claims appended hereto and their equivalents.

The invention claimed is:

1. An intermediate integrated circuit (IC) comprising:
   a receiver;
   a transmitter;
   a referenceless clock circuit coupled to the receiver; and
   training logic coupled to the transmitter; and wherein:
   the training logic is configured to generate a training signal;
   the transmitter transmits the training signal to a first device coupled thereto; and
   the training signal that is output from the intermediate IC is generated without requiring an external reference clock signal.

2. The intermediate IC of claim 1 further comprising:
   a clock data recovery (CDR) circuit for recovering an internal clock signal from a data signal received from a second device; and wherein:
   the training signal is generated using the internal clock signal recovered from the second device.

3. The intermediate IC of claim 1 wherein the CDR circuit further comprises:
   a phase lock loop; and
   a clock scaler coupled to the PLL; and wherein:
   the PLL generates a desired phase, and the clock scalar generates a desired frequency for the internal clock signal of the intermediate IC; and
   the training signal is autonegotiation data specified by an autonegotiation protocol.

4. The intermediate IC of claim 2 wherein:
   the first device has a physical medium device (PMD) interface to the intermediate IC; and
   the second device has a physical medium attachment (PMA) interface to the intermediate IC;
   the internal clock signal of the intermediate IC is recovered from data received from the second device via the PMA interface; and
   the training signal is generated from the internal clock signal of the intermediate IC and transmitted to the first device having the physical medium device interface.

5. The intermediate IC of claim 1 further comprising:
   means for generating an internal clock signal from an external data signal that is not a clock signal; and
   means for generating the training signal based on the internal clock signal.

6. The intermediate IC of claim 1 further comprising:
   means for generating a plurality of increasingly accurate and separate clock signals; and
   wherein:
   each of the plurality of increasingly accurate and separate clock signals is sequentially generated to clock portions of the intermediate IC; and
   each of the plurality of increasingly accurate clock signals has an increasingly accurate frequency and phase.

7. The intermediate IC of claim 1 further comprising:
   an additional receiver;
   an additional transmitter; and
   an additional clock data recovery (CDR) circuit for recovering an additional internal clock signal from a data signal received from a first device; and wherein:
   the additional internal clock signal to operate a device B to device A (B2A) interface in the intermediate IC to communicate data from the first device to the second device.

8. A method of establishing a communication link between two or more ICs, the method comprising:
   generating a referenceless clock signal in an intermediate IC;
   generating a training signal from training logic in the intermediate IC;
   transmitting the training signal from the intermediate IC to a first device coupled to the intermediate IC; and
   wherein:
   the first device requires the training signal to communicate to the intermediate IC; and
   wherein:
   the training signal is generated by the intermediate IC without requiring an external reference clock signal.

9. The method of claim 8 further comprising:
   bringing up and periodically adjusting the frequency of a clock data recovery (CDR) circuit in the intermediate IC using the referenceless clock signal;
   receiving a data signal from a second device at a receiver of the intermediate IC;
   recovering an internal clock signal from the data signal of the second device using the CDR circuit of the intermediate IC; and
   using the internal clock signal to operate a device A to device B (A2B) interface in the intermediate IC to communicate data from the second device to the first device.

10. The method of claim 9 wherein:
    the operation of recovering the internal clock signal further comprises:
    aligning the internal clock signal recovered by the CDR via a phase lock loop (PLL); and
    scaling the internal clock signal via a clock scaler; and
    wherein:

the training signal is an autonegotiation signal generated by the training logic as specified by an autonegotiation protocol.

11. The method of claim 8 wherein:
the first device has a physical medium dependent (PMD) interface to the intermediate IC;
the second device has a physical medium attachment (PMA) interface to the intermediate IC; and
the internal clock signal of the intermediate IC is generated from the data transmitted from the second device.

12. The method of claim 11 wherein:
the data signal received from the second device was generated using a reference clock signal.

13. The method of claim 11 further comprising:
generating an autonegotiation signal using the internal clock signal of the intermediate IC;
communicating the autonegotiation signal to the first device;
receiving a data signal from the first device at a second receiver in the intermediate IC;
generating an additional clock signal from the data signal received from the first device; and
using the additional clock signal to operate a device B to device A (B2A) interface in the intermediate IC to communicate data from the first device to the second device.

14. The method of claim 8 wherein:
a plurality of clock signals are sequentially generated to clock portions of the intermediate IC; and
each of the plurality of clock signals has an increasingly accurate frequency and phase.

15. The method of claim 14 further comprising:
generating a first clock signal not based on a reference clock and not recovered from a data signal, for operating a control plane of the intermediate IC;
generating a second clock signal, recovered from a physical medium attachment (PMA) interface data signal, for generating the training signal; and
generating a third clock signal, recovered from a physical medium dependent (PMD) interface data signal, for communicating high-speed data from a physical medium dependent interface to a physical medium attachment interface.

16. A network system comprising:
a first device;
an intermediate integrated circuit (IC); and
a second device; and wherein:
the intermediate IC is coupled to the first device and to the second device;
the first device requires training in order to communicate with the intermediate IC;
the intermediate IC transmits a training signal to the first device; and
the intermediate IC does not require an external reference clock signal to generate the training signal.

17. The network system of claim 16 wherein:
the intermediate IC comprises:
a clock data recovery (CDR) circuit for generating an internal clock signal from a data signal received from the second device; and wherein:
the training signal is generated using the internal clock signal of the intermediate IC.

18. The network system of claim 17 wherein:
the second device has a physical medium attachment (PMA) interface to the intermediate IC;
the first device has a physical medium dependent (PMD) interface to the intermediate IC; and
the internal clock signal is generated from data received from the second device; and
the training signal is an autonegotiation signal that is generated for the first device from the internal clock signal of the intermediate IC.

19. The network system of claim 17 wherein:
the intermediate IC is configured to:
generate an autonegotiation signal using the internal clock signal of the intermediate IC;
communicate the autonegotiation signal to the first device;
receive a data signal from the first device at a second receiver of the intermediate IC;
recover an additional clock signal from the data signal of the first device; and
use the additional clock signal to operate a device A to device B (B2A) interface in the intermediate IC to communicate data from the first device to the second device.

20. The network system of claim 16 wherein:
the intermediate IC generates a plurality of clock signals that are sequentially used to clock the intermediate IC;
each of the plurality of clock signals has an increasingly accurate frequency and phase; and
the plurality of clock signals comprise:
a first clock signal not based on a reference clock and not recovered from a data signal, for operating a control plane of the intermediate IC;
a second clock signal, recovered from a physical medium attachment (PMA) interface data signal, for generating the training signal; and
a third clock signal, recovered from a physical medium dependent (PMD) interface data signal, for communicating high-speed data from a physical medium dependent interface to a physical medium attachment interface.

* * * * *